US010232429B1

(12) United States Patent
Lin et al.

(10) Patent No.: US 10,232,429 B1
(45) Date of Patent: Mar. 19, 2019

(54) MANDREL-PULLING DISTANCE SENSING ASSEMBLY OF AN ELECTRIC RIVET GUN

(71) Applicant: Yu-Tang Lin, New Taipei (TW)

(72) Inventors: Yu-Tang Lin, New Taipei (TW); Hsien-Yu Kao, New Taipei (TW)

(73) Assignee: Yu-Tang Lin, New Taipei (TW)

( * ) Notice: Subject to any disclaimer, the term of this patent is extended or adjusted under 35 U.S.C. 154(b) by 0 days.

(21) Appl. No.: 16/005,804

(22) Filed: Jun. 12, 2018

(30) Foreign Application Priority Data

Jan. 10, 2018 (TW) .............................. 107200453 U
Mar. 23, 2018 (TW) .............................. 107203789 U

(51) Int. Cl.
*B21J 15/28* (2006.01)
*B21J 15/04* (2006.01)
*B21J 15/26* (2006.01)
*B23P 17/00* (2006.01)
*G01R 33/07* (2006.01)

(52) U.S. Cl.
CPC ............. *B21J 15/043* (2013.01); *B21J 15/26* (2013.01); *B21J 15/28* (2013.01); *G01R 33/072* (2013.01)

(58) Field of Classification Search
CPC .......... B21J 15/043; B21J 15/26; B21J 15/28; G01R 33/072

USPC ..................................................... 72/243.521
See application file for complete search history.

(56) References Cited

U.S. PATENT DOCUMENTS 7,832,074 B2 * 11/2010 Stevenson ............... B21J 15/043
                                                        29/243.521
8,109,123 B2 *  2/2012 Chen ..................... B21J 15/043
                                                        29/243.523

* cited by examiner

*Primary Examiner* — David B Jones
(74) *Attorney, Agent, or Firm* — Rosenberg, Klein & Lee

(57) ABSTRACT

A mandrel-pulling distance sensing assembly of an electric rivet gun is mounted in a barrel of a housing and has a stationary seat, a moving seat, two magnetic elements separately fixed on the stationary seat, and a Hall effect sensor fixed on the moving seat. The moving seat is driven by a driving assembly of the electric rivet gun and is movable relative to the stationary seat. While the Hall effect sensor moves along with the moving seat between the two magnetic elements, the Hall effect sensor detects a changing magnetic field and produces and outputs a changing voltages to a control unit to allow the control unit to operate the driving assembly according to the changing voltages. Thus, the moving seat can be accurately positioned and moving ranges of a snapping device that is driven by the driving assembly can be accurately controlled.

20 Claims, 10 Drawing Sheets

MANDREL-PULLING DISTANCE SENSING ASSEMBLY OF AN ELECTRIC RIVET GUN

CROSS-REFERENCE TO RELATED APPLICATIONS

This application is based upon and claims priority under 35 U.S.C. 119 from Taiwan Patent Application No. 107200453 filed on Jan. 10, 2018 and Taiwan Patent Application No. 107203789 filed on Mar. 23, 2018, which are hereby specifically incorporated herein by this reference thereto.

BACKGROUND OF THE INVENTION

1. Field of the Invention

The present invention relates to a rivet gun, especially to a mandrel-pulling distance sensing assembly of an electric rivet gun.

2. Description of the Prior Art(s)

A rivet is a kind of fastener that can hold at least two working pieces together and includes a mandrel and a rivet body mounted on an end of the mandrel. A rivet gun holds and pulls the mandrel, causing the rivet body to deform and hold the working pieces between a flange of the rivet body and a deformed portion of the rivet body.

A conventional electric rivet gun has a motor and a snapping device that is used for snapping the mandrel. The motor has a rotating shaft. A rotational motion of the rotating shaft is converted into a linear motion via a gear set, such that the snapping device and the mandrel are pulled to move linearly. Therefore, by setting a number of rotations of the rotating shaft of the motor, a linear distance that the snapping device and the mandrel are pulled can be controlled. However, rotational speeds of the rotating shaft of the motor differ with regard to input voltages and the different rotational speeds directly influence a time difference which is occurred when the rotating shaft is switched to rotate reversely. Moreover, after long-term use of the gear set and the motor, teeth of the gear set may be worn down or impurities may accumulate between the teeth of the gear set, causing inaccuracy of positioning the snapping device at specific positions by setting the number of rotation of the rotating shaft of the motor.

In another conventional electric rivet gun, the linear distance that the snapping device and the mandrel are pulled is set by two photo interrupters. One of the photo interrupters is disposed at a start position at which the snapping device has not been pulled. The other photo interrupter is disposed at an end position at which the mandrel of the rivet breaks. Operation of the motor is controlled by the photo interrupters, and accordingly a moving range of the snapping device can be controlled. However, due to ways of mounting the photo interrupters and impurities that accumulate in the electric rivet gun, positions of the photo interrupters and projection angles of light of the photo interrupters may offset. Accordingly, accuracy of the start position and the end position are influenced. Moreover, the light from each of the photo interrupters forms an illumination range. The moving range of the snapping device may differ with regard to the illumination range.

Therefore, no matter positions of the snapping device is controlled by the number of rotations of the rotating shaft of the motor or by the photo interrupters, the accuracy of positioning the snapping device at specific positions is low. The linear distance that the snapping device and the mandrel are pulled cannot be accurately controlled.

To overcome the shortcomings, the present invention provides a mandrel-pulling distance sensing assembly of an electric rivet gun to mitigate or obviate the aforementioned problems.

SUMMARY OF THE INVENTION

The main objective of the present invention is to provide a mandrel-pulling distance sensing assembly of an electric rivet gun. The mandrel-pulling distance sensing assembly is mounted in a barrel of a housing of the electric rivet gun and has a stationary seat, a moving seat, two magnetic elements, and a Hall effect sensor. The stationary seat is securely fixed in the barrel of the housing. The moving seat is mounted in the barrel of the housing and is able to move relative to the stationary seat and between a front end of the barrel and a rear end of the barrel. The magnetic elements are securely fixed on the stationary seat and are separately arranged along a moving path of the moving seat. The Hall effect sensor is securely fixed on the moving seat and moves along with the moving seat between the two magnetic elements.

While the Hall effect sensor on the moving seat moves between the magnetic element that is positioned toward the front end of the barrel and the magnetic element that is positioned toward the rear end of the barrel, the Hall effect sensor detects a changing magnetic field and produces and outputs a changing voltages to a control unit to allow the control unit to operate a motor of a driving assembly of the electric rivet gun according to the changing voltages. Thus, the moving seat can be accurately positioned. Accordingly, moving ranges of a snapping device that is driven by the driving assembly can be accurately controlled.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
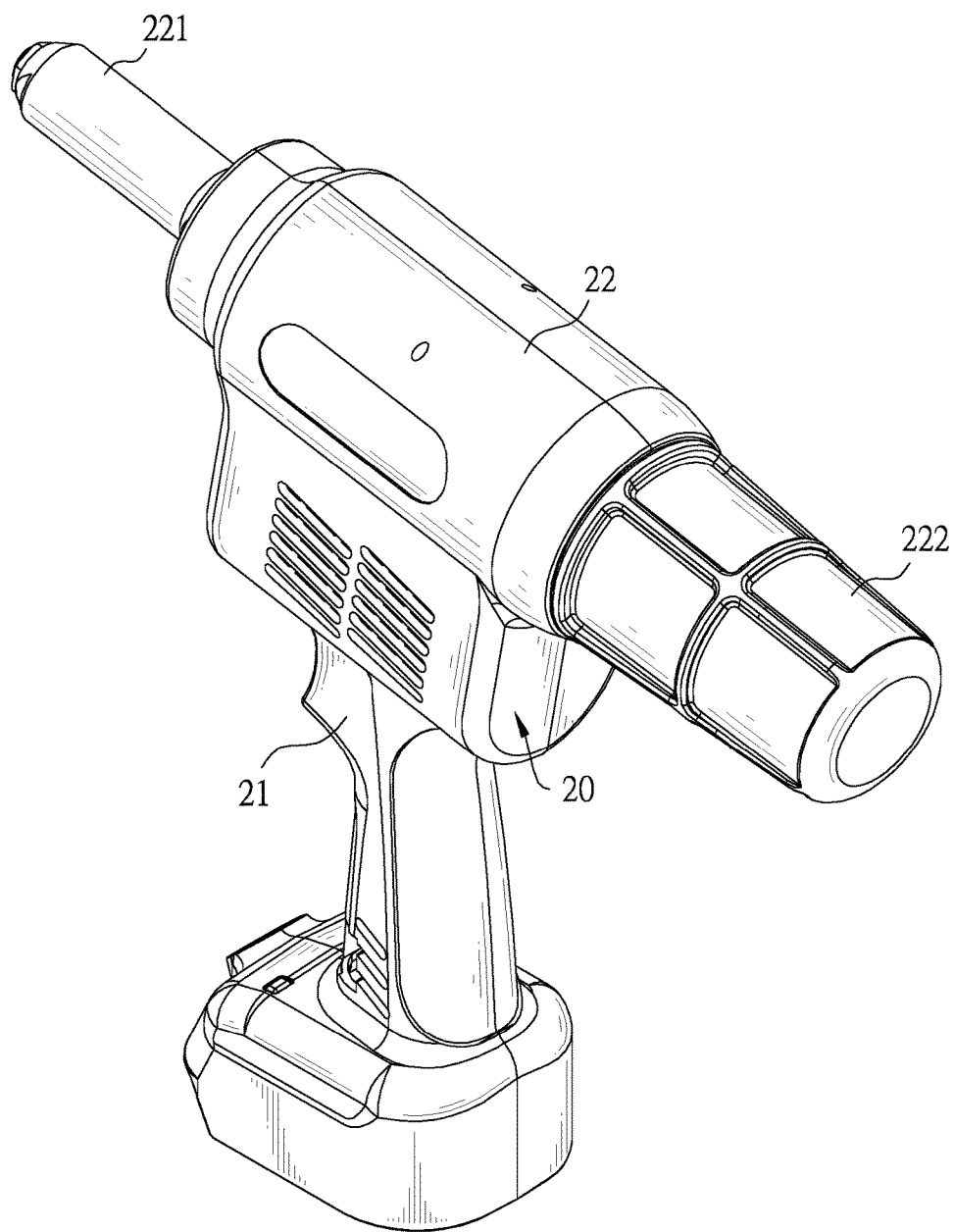
FIG. 1 is a perspective view of an electric rivet gun having a mandrel-pulling distance sensing assembly in accordance with the present invention.
Figure 2A:
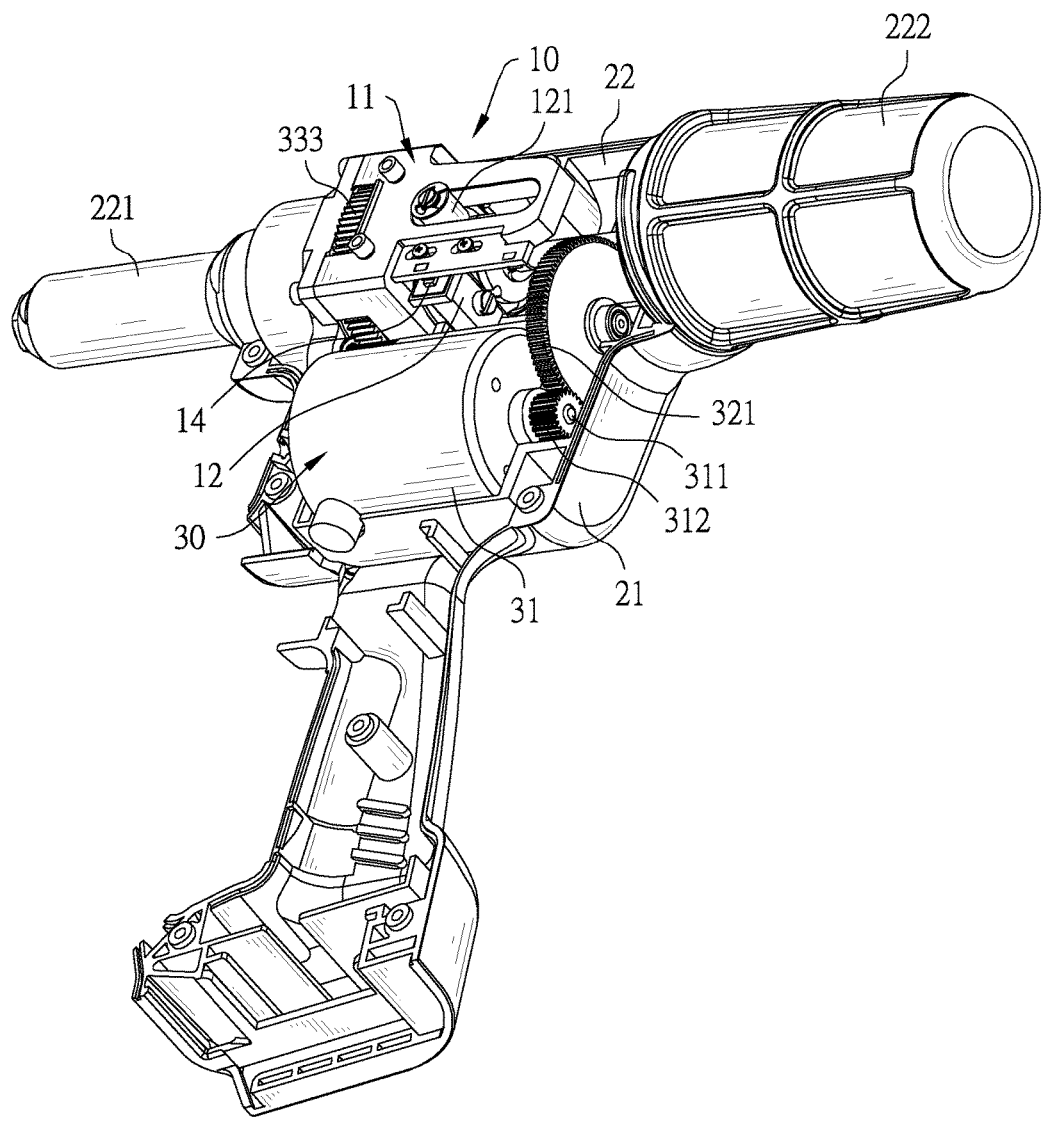
FIG. 2A is perspective view of the electric rivet gun in FIG. 1, showing a part of a housing of the electric rivet gun being removed.

With reference to FIGS. 1 and 2A, a mandrel-pulling distance sensing assembly 10 in accordance with the present invention is mounted in a housing 20 of an electric rivet gun. The housing 20 has a handle 21 and a barrel 22. The barrel 22 is formed on an upper end of the handle 21 and has two opposite ends. The two opposite ends of the barrel 22 are respectively defined as a front end 221 and a rear end 222. A snapping device for snapping a mandrel of a rivet is mounted in the front end 221 of the barrel 22.

Figure 2B:
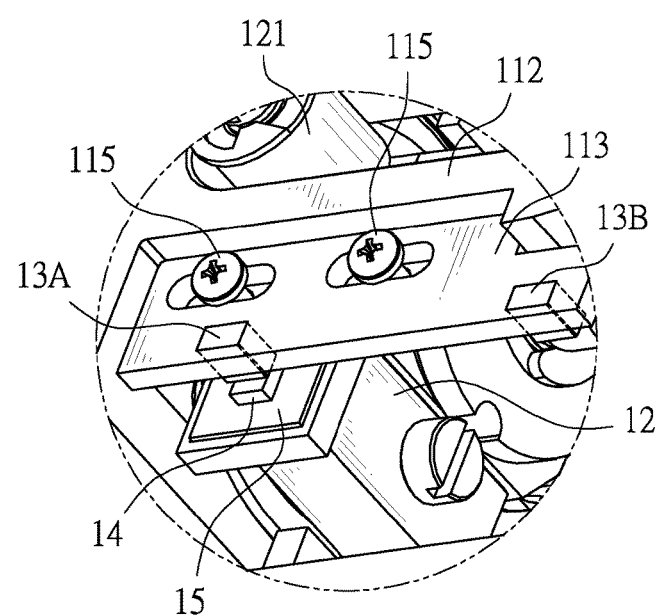
FIG. 2B is an enlarged perspective view of the electric rivet gun in FIG. 2A.
Figure 3:
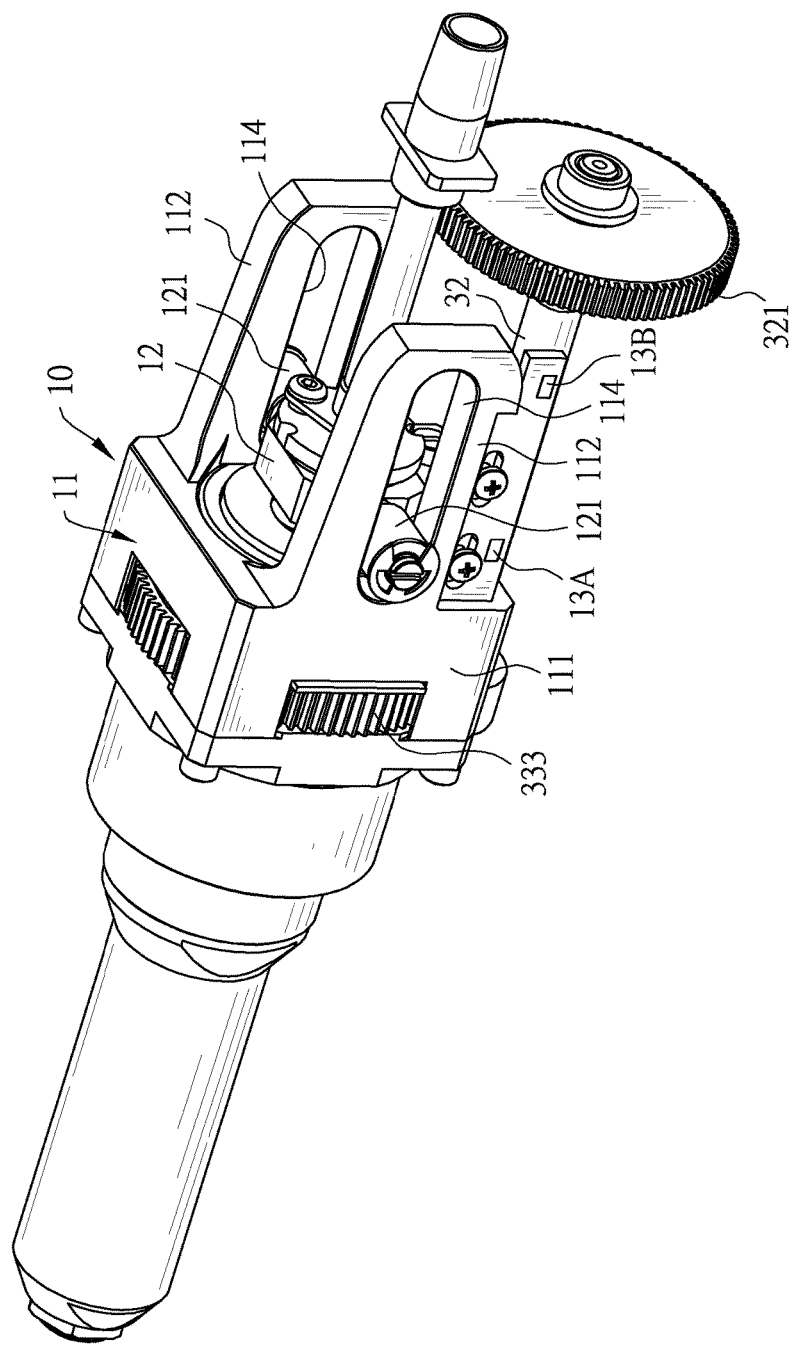
FIG. 3 is a perspective view of the mandrel-pulling distance sensing assembly of the electric rivet gun in FIG. 1.
Figure 4:
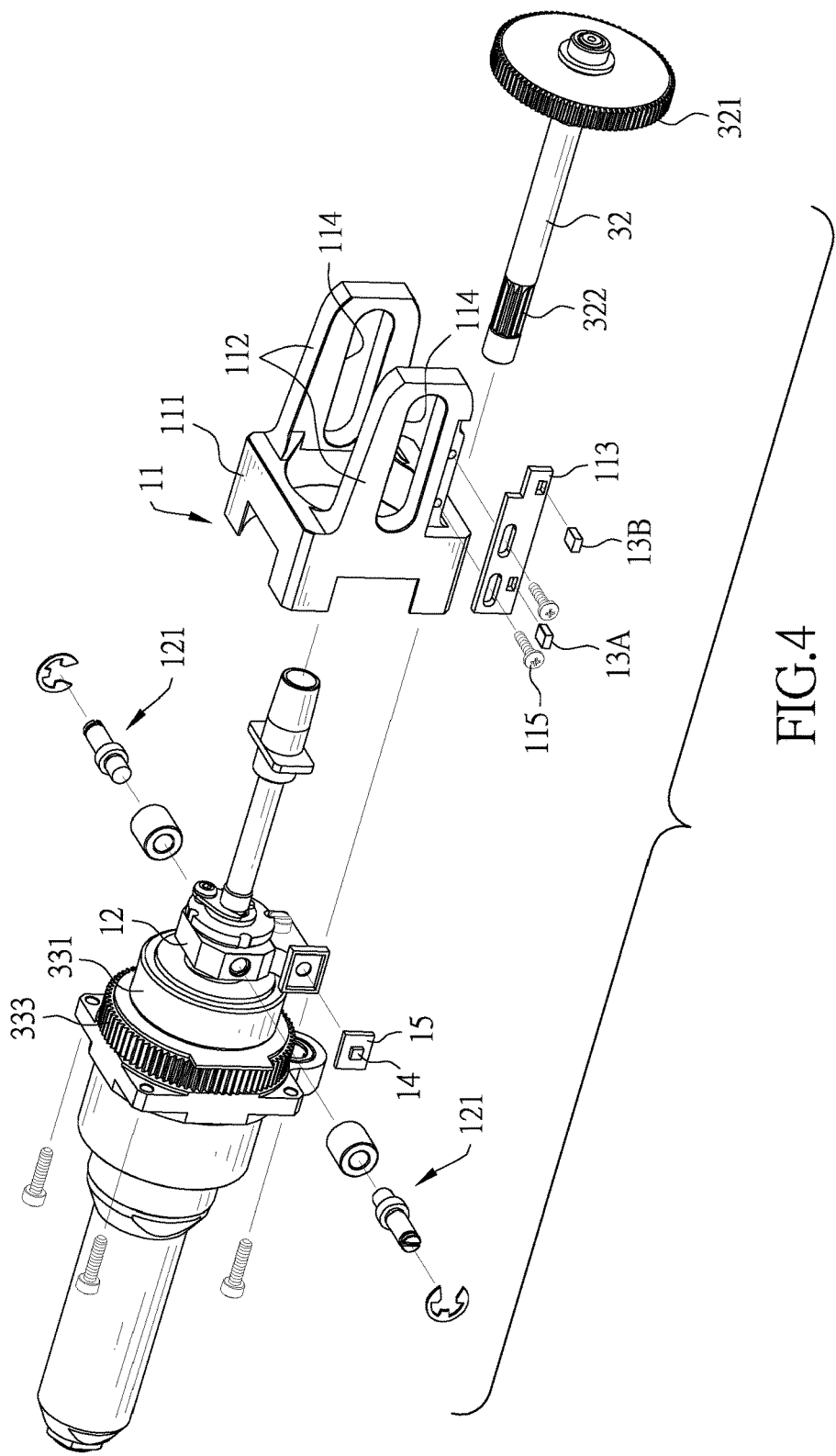
FIG. 4 is an exploded perspective view of the mandrel-pulling distance sensing assembly in FIG. 1.

With further reference to FIGS. 2B, 3, and 4, the mandrel-pulling distance sensing assembly 10 is mounted in the barrel 22 of the housing 20 and comprises a stationary seat 11, a moving seat 12, two magnetic elements 13A, 13B, and a Hall effect sensor 14.

The stationary seat 11 is securely fixed in the barrel 22 of the housing 20 and has a base 111, two extension arms 112, and a mounting panel 113. The base 111 is securely mounted in the housing 20. The extension arms 112 separately protrude from an end surface of the base 111. Each of the extension arms 112 has an elongated guiding hole 114. The elongated guiding hole 114 is formed through the extension arm 112 and has two ends respectively positioned toward the front end 221 and the rear end 222 of the barrel 22. The mounting panel 113 is disposed on one of the extension arms 112.

As shown in FIG. 4, in a preferred embodiment, the mounting panel 113 of the stationary seat 11 and the extension arm 112 for disposing the mounting panel 113 are separate parts. The mounting panel 113 is securely attached to the extension arm 112 via at least one screw 115.

Figure 7:
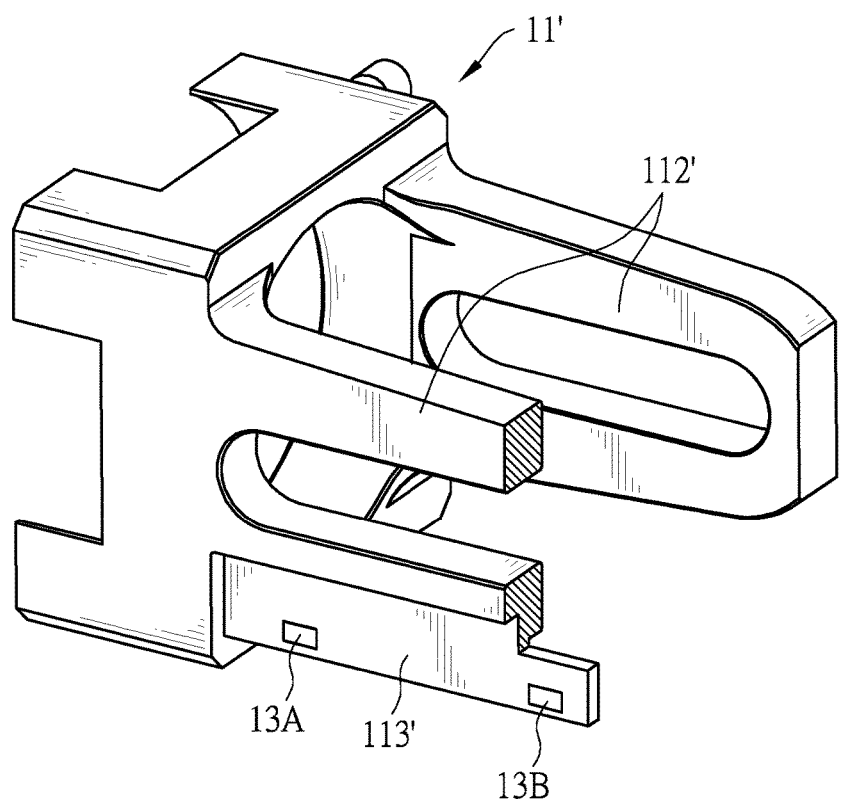
FIG. 7 is a perspective view of another preferred embodiment of a stationary seat of the mandrel-pulling distance sensing assembly in accordance with the present invention.

With further reference to FIG. 7, in another preferred embodiment, the mounting panel 113' of the stationary seat 11' and the extension arm 112 for disposing the mounting panel 113' are integrally formed as a single part.

The moving seat 12 is mounted in the barrel 22 of the housing 20, is disposed between the extension arms 112 of the stationary seat 11, and is able to move relative to the stationary seat 11 and between the front end 221 of the barrel 22 and the rear end 222 of the barrel 22. The moving seat 12 has two guiding rods 121. The guiding rods 121 respectively protrude from two opposite sides of the moving seat 12 and respectively protrude into the elongated guiding holes 114 of the extension arms 112 of the stationary seat 11. Thus, each of the guiding rods 121 is able to slide along a corresponding one of the elongated guiding holes 114, such that a moving range and a moving distance of the moving seat 12 can be limited by the elongated guiding holes 114. Moreover, stability of the moving seat 12 while moving can be enhanced.

The two magnetic elements 13A, 13B are securely fixed on the mounting panel 113, 113' of the stationary seat 11, 11' and are separately arranged along a moving path of the moving seat 12. One of the magnetic elements 13A is positioned toward the front end 221 of the barrel 22. The other magnetic element 13B is positioned toward the rear end 222 of the barrel 22. A distance between the two magnetic elements 13A, 13B is defined by a length of the mandrel that is supposed to be pulled.

As shown in FIGS. 3 and 4, in a preferred embodiment, the two magnetic elements 13A, 13B are immovably embedded in the mounting panel 113, 113', such that the distance between the two magnetic elements 13A, 13B is fixed.

Figure 8:
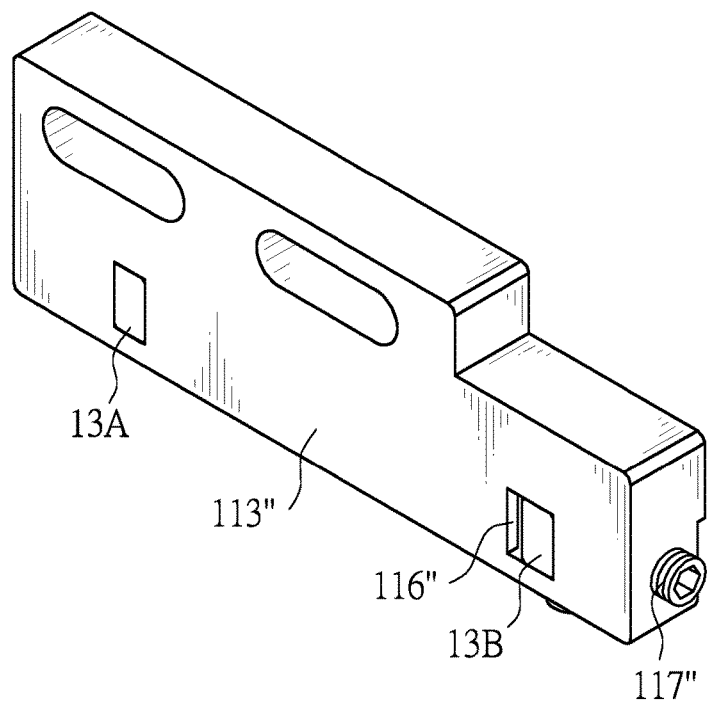
FIG. 8 is a perspective view of another preferred embodiment of a mounting panel and two magnetic elements of the mandrel-pulling distance sensing assembly in accordance with the present invention.
Figure 9:
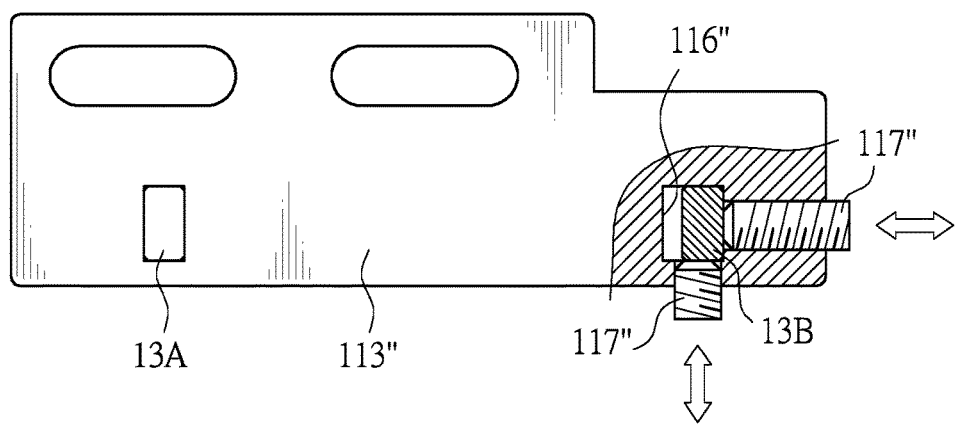
FIG. 9 is a front view in partial section of the mounting panel and the magnetic elements of the mandrel-pulling distance sensing assembly in FIG. 8.

With further reference to FIGS. 8 and 9, in another preferred embodiment, one magnetic element 13A is immovably embedded in the mounting panel 113" and the other magnetic element 13B is adjustably embedded in the mounting panel 113". The adjustable magnetic element 13B can be selectively moved toward or away from the immovably magnetic element 13A so as to finely adjust the distance between the two magnetic elements 13A, 13B.

As shown in FIGS. 8 and 9, specifically, the mounting panel 113" has a through hole 116" for mounting the adjustable magnetic element 13B. The through hole 116" is formed through the mounting panel 113" and has a width wider than a width of the adjustable magnetic element 13B. The width of the through hole 116" and the width of the adjustable magnetic element 13B are defined as lengths extending toward the front end 221 of the barrel 22 and the rear end 222 of the barrel 22. Thus, the adjustable magnetic element 13B can slide in the through hole 116". Moreover, two positioning screws 117" are perpendicularly mounted through the mounting panel 113", protrude into the through hole 116", and abut against the adjustable magnetic element 13B. Thus, the adjustable magnetic element 13B is held between the positioning screws 117" and a hole wall defined around the through hole 116".

The Hall effect sensor 14 is securely fixed on the moving seat 12, moves along with the moving seat 12, and moves between the two magnetic elements 13A, 13B. The Hall effect sensor 14 detects a changing magnetic field between the magnetic elements 13A, 13B, such that a current is inducted in the Hall effect sensor 14 to produce and output changing voltages to a control unit. Specifically, the Hall effect sensor 14 is soldered on a printed circuit board (PCB) 15. Then the PCB 15 is adhered to the moving seat 12 by adhesive or is securely embedded in the moving seat 12.

Figure 5:
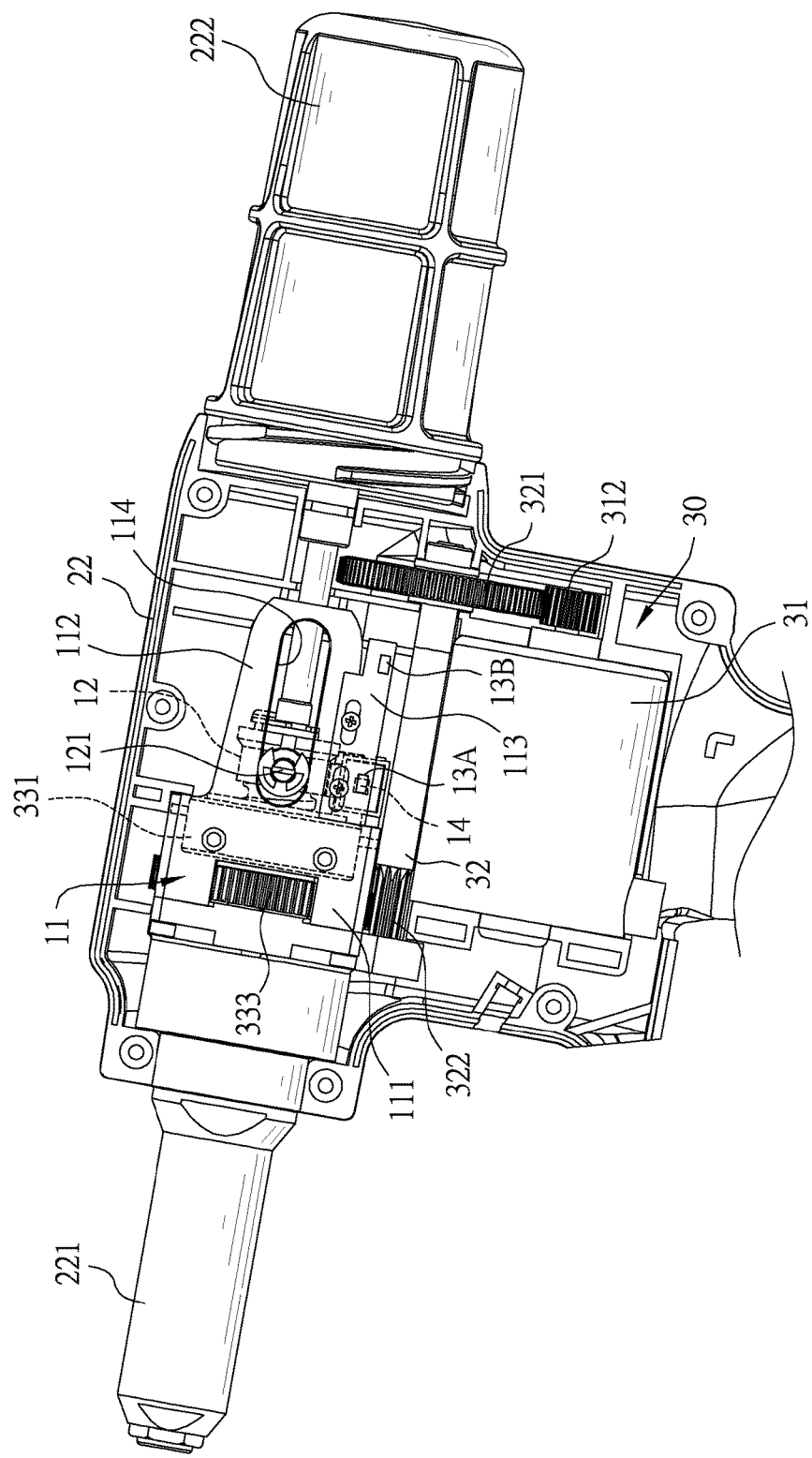
FIG. 5 is an enlarged side view of the electric rivet gun in FIG. 2A, showing a Hall effect sensor corresponding in position to a magnetic element.

With reference to FIGS. 2A and 5, specifically, the moving seat 12 is driven by a driving assembly 30 of the electric rivet gun to move back and forth between the front end 221 of the barrel 22 and the rear end 222 of the barrel 22. The driving assembly 30 is mounted in the housing 20 and includes a motor 31, a driving shaft 32, and a ball screw 33.

The motor 31 is mounted in the handle 21 of the housing 20 and has a rotating shaft 311 and a driving gear 312 mounted on the rotating shaft 311.

The driving shaft 32 is mounted in the handle 21 and the barrel 22 of the housing 20. An input gear 321 and an output gear 322 are respectively mounted on two ends of the driving shaft 32. The input gear 321 meshes with the driving gear 312 of the motor 31. A number of teeth of the input gear 321 are more than a number of teeth of the output gear 322 and a number of teeth of the driving gear 312.

The ball screw 33 is mounted in the barrel 22 of the housing 20 and includes a nut 331, a transmission gear 333, and a screw shaft 332. The nut 331 is rotatably mounted in the barrel 22. The transmission gear 333 is mounted around an outer surface of the nut 331 and meshes with the output gear 322 of the driving shaft 32. The screw shaft 332 is mounted through the nut 331. Multiple steel balls are mounted between the screw shaft 332 and the nut 331. An end of the screw shaft 332 is connected to the snapping device and another end of the screw shaft 332 is connected to the moving seat 12. Thus, when the motor 31 drives the rotating shaft 311 and the driving gear 312 to rotate, the driving shaft 32 rotates accordingly and drives the transmission gear 333 and the nut 331 to rotate. Then the snapping device and the moving seat 12 are driven by the screw shaft 332 to move linearly along with the screw shaft 332.

As shown in FIG. 5, when the electric rivet gun has not been operated, the moving seat 12 and the screw shaft 332 of the ball screw 33 are disposed at a start position, and the Hall effect sensor 14 corresponds in position to the magnetic element 13A that is positioned toward the front end 221 of the barrel 22.

Figure 6:
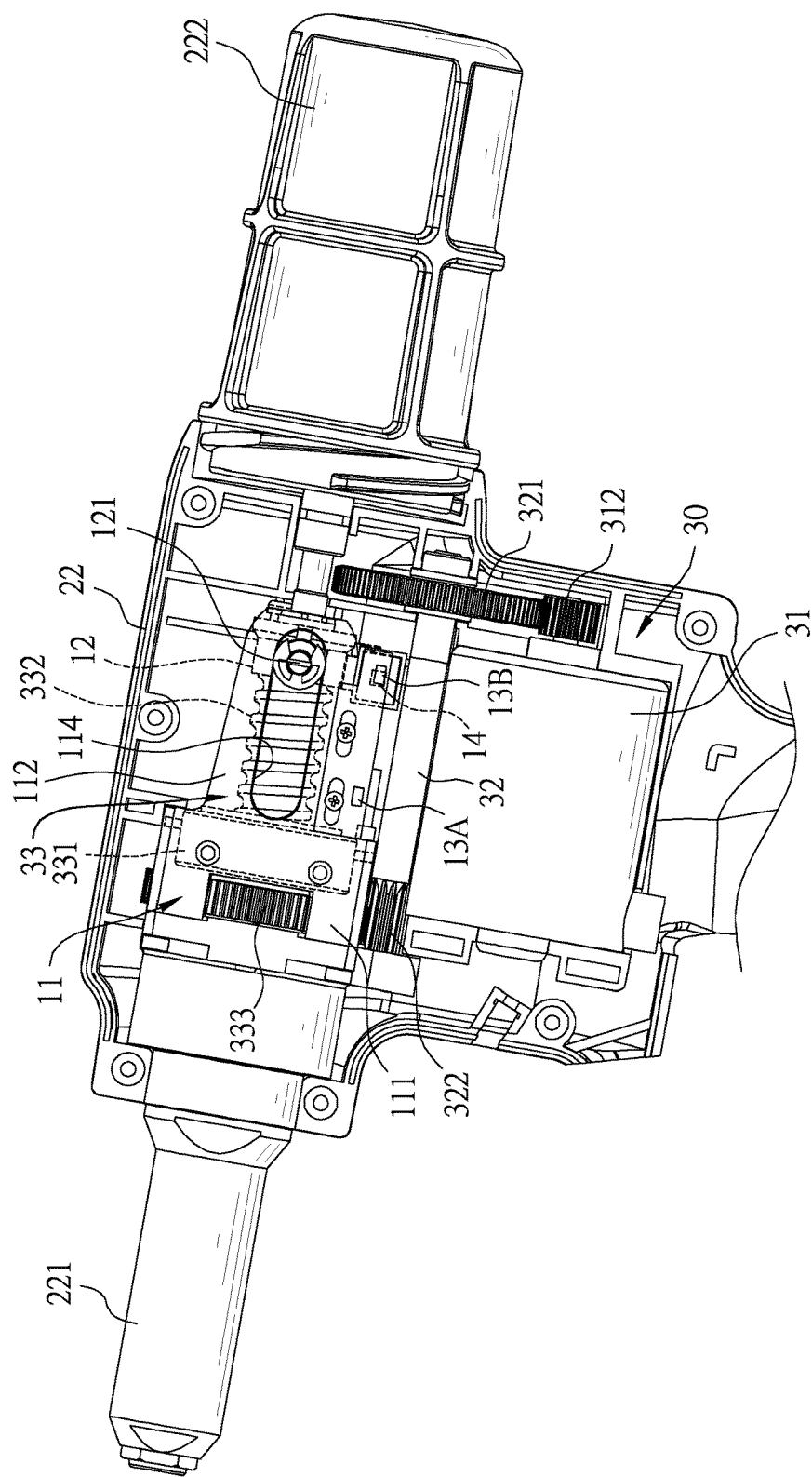
FIG. 6 is an enlarged side view of the electric rivet gun in FIG. 2A, showing the Hall effect sensor corresponding in position to another magnetic element.

With further reference to FIG. 6, when a trigger of the electric rivet gun is pressed, the control unit activates the motor 31 and controls a rotational speed of the motor 31. The motor 31 drives the driving shaft 32 to rotate via the driving gear 312 and the input gear 321. Then the driving shaft 32 drives the nut 331 of the ball screw 33 to rotate via the output gear 322 and the transmission gear 333. The screw shaft 332 of the ball screw 33 drives the moving seat 12 to move toward the rear end 222 of the barrel 22 until the mandrel of the rivet breaks. Afterwards, as the trigger is released, the motor 31 is controlled by the control unit to drive the driving shaft 32 to rotate reversely, such that the moving seat 12 is driven to move toward the front end 221 of the barrel 22 via the ball screw 33 until the moving seat 12 moves back to the start position. Meanwhile, the broken mandrel is ejected from the snapping device. By detecting the changing magnetic field between the magnetic elements 13A, 13B with the Hall effect sensor 14, a travel distance of the screw shaft 332 of the ball screw 33 and a position of the moving seat 12 can be ensured, so as to perform and complete a mandrel-pulling process.

While the Hall effect sensor 14 on the moving seat 12 moves between the magnetic element 13A that is positioned toward the front end 221 of the barrel 22 and the magnetic element 13B that is positioned toward the rear end 222 of the barrel 22, the Hall effect sensor 14 detects the changing magnetic field and produces and outputs the changing voltages to the control unit to allow the control unit to operate the motor 21 according to the changing voltages. Thus, the moving seat 12 can be accurately positioned. Accordingly, moving ranges of the screw shaft 332 of the ball screw 33 and the snapping device can be accurately controlled. Accordingly, a distance that the mandrel is pulled is also accurately controlled. Furthermore, by finely adjust the distance between the two magnetic elements 13A, 13B, the distance that the mandrel is pulled can be finely adjusted accordingly.

The mandrel-pulling distance sensing assembly of the electric rivet gun as described has the following advantages. The magnetic elements 13A, 13B with high permeability are structurally fixed on two positions respectively. A specific magnetic pole (N pole/S pole) of each of the magnetic elements 13A, 13B faces the Hall effect sensor 14 according to use requirements of the Hall effect sensor 14. Thus, the control unit can control the motor 31 accordingly to information detected by the Hall effect sensor 14, so as to accurately locate the Hall effect sensor 14, the moving seat 12, the screw shaft 332 of the ball screw 33, and the snapping device at specific positions.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A mandrel-pulling distance sensing assembly of an electric rivet gun, the mandrel-pulling distance sensing assembly mounted in a barrel of a housing of the electric rivet gun and comprising:

a stationary seat securely fixed in the barrel of the housing;

a moving seat mounted in the barrel of the housing and being able to move relative to the stationary seat and between a front end of the barrel and a rear end of the barrel;

two magnetic elements securely fixed on the stationary seat and separately arranged along a moving path of the moving seat; and a Hall effect sensor securely fixed on the moving seat, moving along with the moving seat, and moving between the two magnetic elements.

2. The mandrel-pulling distance sensing assembly as claimed in claim 1, wherein the stationary seat having
   a base securely mounted in the housing;
   two extension arms separately protruding from an end surface of the base, each of the extension arms having an elongated guiding hole, the elongated guiding hole formed through the extension arm and having two ends respectively positioned toward the front end of the barrel and the rear end of the barrel; and
   a mounting panel disposed on one of the extension arms; and the moving seat disposed between the extension arms of the stationary seat and having two guiding rods, and the guiding rods respectively protruding from two opposite sides of the moving seat and respectively protruding into the elongated guiding holes of the extension arms of the stationary seat.

3. The mandrel-pulling distance sensing assembly as claimed in claim 2, wherein the mounting panel of the stationary seat and the extension arm for disposing the mounting panel are separate parts, and the mounting panel is securely attached to the extension arm via at least one screw.

4. The mandrel-pulling distance sensing assembly as claimed in claim 2, wherein the mounting panel of the stationary seat and the extension arm for disposing the mounting panel are integrally formed as a single part.

5. The mandrel-pulling distance sensing assembly as claimed in claim 1, wherein the two magnetic elements are immovably embedded in the mounting panel of the stationary seat.

6. The mandrel-pulling distance sensing assembly as claimed in claim 2, wherein the two magnetic elements are immovably embedded in the mounting panel of the stationary seat.

7. The mandrel-pulling distance sensing assembly as claimed in claim 3, wherein the two magnetic elements are immovably embedded in the mounting panel of the stationary seat.

8. The mandrel-pulling distance sensing assembly as claimed in claim 4, wherein the two magnetic elements are immovably embedded in the mounting panel of the stationary seat.

9. The mandrel-pulling distance sensing assembly as claimed in claim 1, wherein one magnetic element is immovably embedded in the mounting panel; and
   the other magnetic element is adjustably embedded in the mounting panel, and the adjustable magnetic element is selectively moved toward or away from the immovably magnetic element.

10. The mandrel-pulling distance sensing assembly as claimed in claim 2, wherein one magnetic element is immovably embedded in the mounting panel; and the other magnetic element is adjustably embedded in the mounting panel, and the adjustable magnetic element is selectively moved toward or away from the immovably magnetic element.

11. The mandrel-pulling distance sensing assembly as claimed in claim 3, wherein one magnetic element is immovably embedded in the mounting panel; and the other magnetic element is adjustably embedded in the mounting panel, and the adjustable magnetic element is selectively moved toward or away from the immovably magnetic element.

12. The mandrel-pulling distance sensing assembly as claimed in claim 4, wherein one magnetic element is immovably embedded in the mounting panel; and the other magnetic element is adjustably embedded in the mounting panel, and the adjustable magnetic element is selectively moved toward or away from the immovably magnetic element.

13. The mandrel-pulling distance sensing assembly as claimed in claim 9, wherein the mounting panel of the stationary seat has a through hole for mounting the adjustable magnetic element, the through hole is formed through the mounting panel and has a width wider than a width of the adjustable magnetic element; and two positioning screws are perpendicularly mounted through the mounting panel, protrude into the through hole, and abut against the adjustable magnetic element.

14. The mandrel-pulling distance sensing assembly as claimed in claim 10, wherein the mounting panel of the stationary seat has a through hole for mounting the adjustable magnetic element, the through hole is formed through the mounting panel and has a width wider than a width of the adjustable magnetic element; and two positioning screws are perpendicularly mounted through the mounting panel, protrude into the through hole, and abut against the adjustable magnetic element.

15. The mandrel-pulling distance sensing assembly as claimed in claim 11, wherein the mounting panel of the stationary seat has a through hole for mounting the adjustable magnetic element, the through hole is formed through the mounting panel and has a width wider than a width of the adjustable magnetic element; and two positioning screws are perpendicularly mounted through the mounting panel, protrude into the through hole, and abut against the adjustable magnetic element.

16. The mandrel-pulling distance sensing assembly as claimed in claim 12, wherein the mounting panel of the stationary seat has a through hole for mounting the adjustable magnetic element, the through hole is formed through the mounting panel and has a width wider than a width of the adjustable magnetic element; and two positioning screws are perpendicularly mounted through the mounting panel, protrude into the through hole, and abut against the adjustable magnetic element.

17. The mandrel-pulling distance sensing assembly as claimed in claim 1, wherein the Hall effect sensor is soldered on a printed circuit board (PCB), and the PCB is adhered to the moving seat by adhesive.

18. The mandrel-pulling distance sensing assembly as claimed in claim 2, wherein the Hall effect sensor is soldered on a PCB, and the PCB is adhered to the moving seat by adhesive.

19. The mandrel-pulling distance sensing assembly as claimed in claim 1, wherein the Hall effect sensor is soldered on a PCB, and the PCB is securely embedded in the moving seat.

20. The mandrel-pulling distance sensing assembly as claimed in claim 2, wherein the Hall effect sensor is soldered on a PCB, and the PCB is securely embedded in the moving seat.

* * * * *